(12) United States Patent
Lee

(10) Patent No.: US 6,759,335 B2
(45) Date of Patent: Jul. 6, 2004

(54) BURIED STRAP FORMATION METHOD FOR SUB-150 NM BEST DRAM DEVICES

(75) Inventor: Brian Lee, Hsinchu (TW)

(73) Assignee: ProMos Technologies, Inc., Hsin-Chu (TW)

(*) Notice: Subject to any disclaimer, the term of this patent is extended or adjusted under 35 U.S.C. 154(b) by 0 days.

(21) Appl. No.: 10/020,754

(22) Filed: Dec. 12, 2001

(65) Prior Publication Data
US 2003/0109140 A1 Jun. 12, 2003

(51) Int. Cl.[7] .......................................... H01L 21/301
(52) U.S. Cl. ............................... 438/694; 438/700
(58) Field of Search .......................... 438/243, 244, 438/270, 386, 387, 694, 700, 702

(56) References Cited

U.S. PATENT DOCUMENTS

| | | | |
|---|---|---|---|
| 5,981,332 A | 11/1999 | Mandelman et al. | 438/246 |
| 6,008,104 A | 12/1999 | Schrems | 438/386 |
| 6,025,245 A * | 2/2000 | Wei | 438/386 |
| 6,080,618 A | 6/2000 | Bergner et al. | 438/243 |
| 6,124,206 A | 9/2000 | Flietner et al. | 438/692 |
| 6,140,673 A | 10/2000 | Kohyama | 257/301 |
| 6,163,045 A * | 12/2000 | Mandelman et al. | 257/301 |
| 6,184,091 B1 * | 2/2001 | Gruening et al. | 438/270 |
| 6,204,112 B1 * | 3/2001 | Chakravarti et al. | 438/243 |
| 6,211,006 B1 | 4/2001 | Tsai et al. | 438/246 |
| 6,271,079 B1 * | 8/2001 | Wei et al. | 438/243 |
| 6,284,593 B1 | 9/2001 | Mandelman et al. | 438/248 |
| 6,291,286 B1 | 9/2001 | Hsiao | 438/238 |
| 6,355,529 B2 * | 3/2002 | Heo et al. | 438/270 |
| 6,534,359 B2 * | 3/2003 | Heo et al. | 438/243 |

* cited by examiner

*Primary Examiner*—Kin-Chan Chen
(74) *Attorney, Agent, or Firm*—George O. Saile; Stephen B. Ackerman; Rosemary L. S. Pike

(57) ABSTRACT

An improved buried strap method in the fabrication of a DRAM integrated circuit device is described. A deep trench is etched into a substrate. A collar is formed on an upper portion of the deep trench. A buried plate is formed by doping around a lower portion of the deep trench and a capacitor dielectric layer is formed within the deep trench. The deep trench is filled with a silicon layer wherein the silicon layer forms a deep trench capacitor and covers the collar. The silicon layer is recessed below a top surface of the substrate to leave a recess. A top portion of the collar is etched away to leave a collar divot. A hemispherical grain polysilicon layer is selectively deposited into the deep trench and filling the collar divot. The HSG layer is doped in-situ or by post plasma doping. The doped hemispherical grain polysilicon layer forms a buried strap in the fabrication of a deep trench DRAM integrated circuit device.

25 Claims, 8 Drawing Sheets

BURIED STRAP FORMATION METHOD FOR SUB-150 NM BEST DRAM DEVICES

BACKGROUND OF THE INVENTION (1) Field of the Invention

The present invention relates to the fabrication of integrated circuit devices, and more particularly, to a method of fabricating an improved buried strap in deep trench DRAM devices in the fabrication of integrated circuits.

(2) Description of the Prior Art

In the fabrication of integrated circuit devices, a buried strap has been used in fabricating deep trench (DT)-based dynamic random access memory (DRAM) devices. The buried strap is a crucial part of the integration step connecting a storage node capacitor to an array switching transistor by forming a diffusion junction. Therefore, control of diffusion length and resistivity of the buried strap are key issues for a healthy interconnect between array devices and capacitors. The diffusion length and resistivity primarily depend upon buried strap width and thickness and thermal budget during post processes.

In a conventional deep trench process, a deep trench is etched. A sacrificial layer fills the trench. A first recess, recess 1, is formed by removing the sacrificial layer from an upper portion of the trench. A dielectric collar is formed conformally in the upper portion of the deep trench. The sacrificial layer is removed, buried plate doping and node dielectric are formed, and a polysilicon layer fills the trench. A second recess, recess 2, is formed to lower the top surface of the polysilicon layer below the substrate surface. A portion of the collar is removed and a second doped polysilicon layer is deposited and planarized by CMP. Now, a third recess, recess 3, is formed to lower the second polysilicon layer below the substrate surface. The buried strap is formed by dopant out-diffusion from the recessed second polysilicon layer during post recess 3 thermal processes.

However, this conventional scheme cannot accurately control the buried strap depth, thickness, and doping level because of the complex interactions of the recess 2, collar removal, and recess 3 steps. Thus, the buried strap junction diffusion is poorly controlled. The recess 3 depth is especially hard to control inasmuch as it is sensitive to both remaining silicon nitride thickness and critical dimension which are varying. A shallow etch results in over diffusion causing short channel effects while a deep etch results in an open circuit, cutting off the current path. This limited controllability makes the BuriEd STrap (BEST) DRAM cell extendibility limited to a shorter generation.

A number of patents have addressed aspects of DRAM fabrication. U.S. Pat. No. 6,211,006 to Tsai et al shows a trench-type capacitor. U.S. Pat. No. 6,124,206 to Flietner et al teaches forming deep trench capacitors. U.S. Pat. No. 6,080,618 to Bergner et al discloses formation of a buried strap with little thickness variation. The buried strap is formed where the collar is partially removed. U.S. Pat. No. 6,008,104 to Schrems shows a BEST DRAM process. U.S. Pat. No. 5,981,332 to Mandelman et al shows a BEST DRAM process.

SUMMARY OF THE INVENTION

Accordingly, it is a primary object of the present invention to provide an effective and very manufacturable method of BEST DRAM formation in the fabrication of integrated circuits.

It is a further object of the invention to provide a method of forming an improved buried strap in DRAM device fabrication.

Another object of the invention is to provide an improved buried strap formation method using a selective hemispherical grain (HSG) method in the fabrication of a DRAM integrated circuit device.

Yet another object of the invention is to provide an improved buried strap formation method using plasma doping in the fabrication of a DRAM integrated circuit device.

A further object of the invention is to provide an improved buried strap formation method having a ground rule of less than or equal to 0.25 $\mu$m in the fabrication of a DRAM integrated circuit device.

A still further object of the invention is to provide an improved buried strap formation method using a selective HSG method along with plasma doping in the fabrication of a DRAM integrated circuit device.

In accordance with the objects of the invention, an improved buried strap method in the fabrication of a DRAM integrated circuit device is achieved. A deep trench is etched into a substrate. A collar is formed on an upper portion of the deep trench. A buried plate is formed by doping around a lower portion of the deep trench and a capacitor dielectric layer is formed within the deep trench. The deep trench is filled with a silicon layer wherein the silicon layer forms a deep trench capacitor and covers the collar. The silicon layer is recessed below a top surface of the substrate to leave a recess. A top portion of the collar is etched away to leave a collar divot. A hemispherical grain polysilicon layer is selectively deposited into the deep trench and filling the collar divot. The HSG layer is doped in-situ or by post plasma doping. The doped hemispherical grain polysilicon layer forms a buried strap in the fabrication of a deep trench DRAM integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention provides an improved buried strap formation method in the fabrication of DRAM integrated circuit devices. In this invention, preferably a selective hemispherical grain (HSG) polysilicon deposition scheme is used to deposit a controlled thickness of polysilicon over an amorphous silicon layer. The process of the present invention controls buried strap thickness and doping level.

Figure 1:
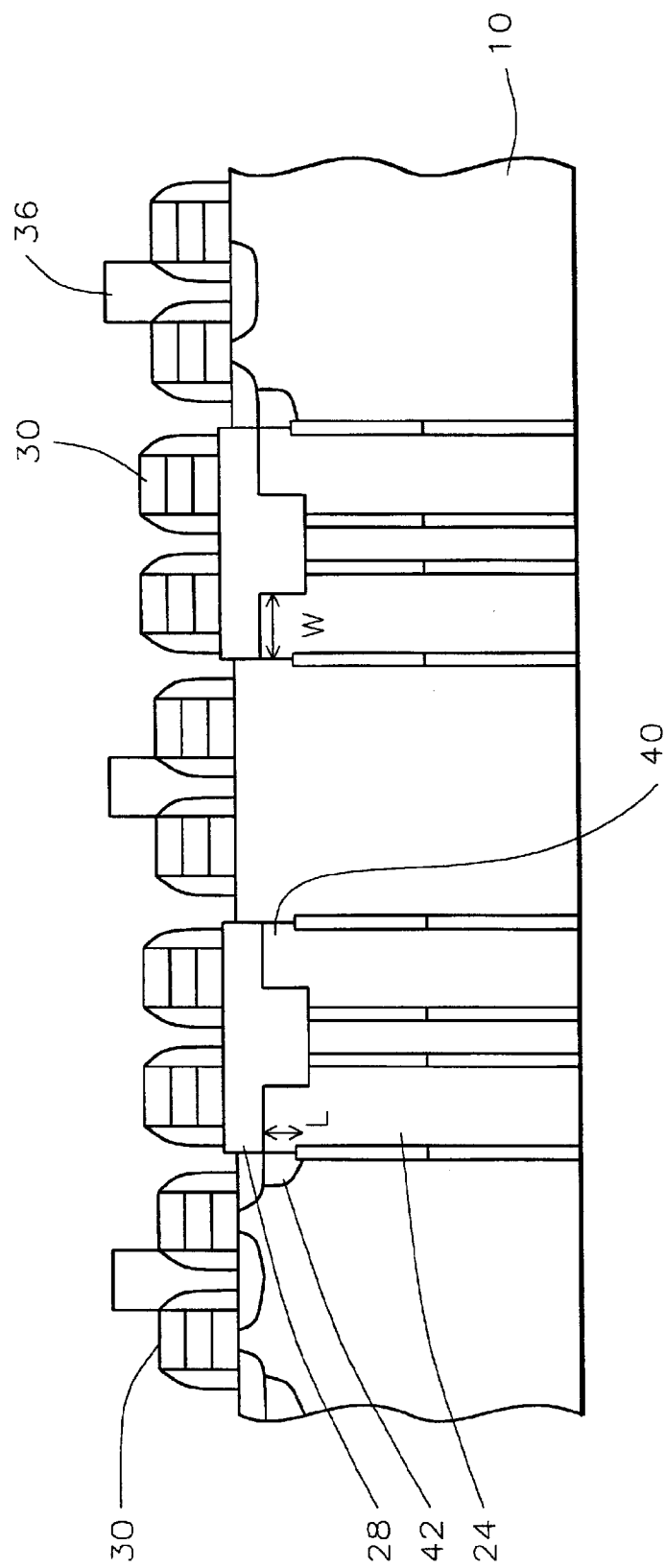
FIGS. 1 through 14 are cross-sectional representations of a preferred embodiment of the present invention.

Referring now more particularly to FIG. 1, there is shown a semiconductor substrate 10. Deep trench capacitor 24 has been formed partially underlying shallow trench isolation 28. Gate electrodes and interconnection lines 30 and bit lines 36 have been formed overlying the semiconductor substrate. Buried strap 40 forms diffusion junction 42. L is the buried strap height defined by (recess 2–recess 3) in the conventional scheme. W is the buried strap width defined by the overlap between the deep trench and the active area. The junction depth of the buried strap diffusion junction 42 is a function of the buried strap height, temperature, and time during the post recess anneal step. Buried strap resistance is a function of the doping concentration of the second polysilicon layer, the buried strap junction depth, and buried strap width. It is desired to have a minimal buried strap resistance which defines drain sheet resistance.

Figure 2:
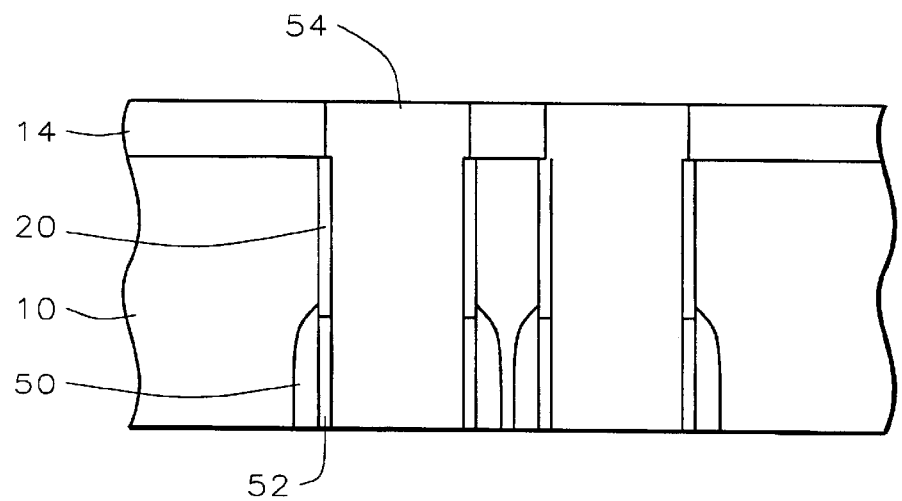

Referring now to FIGS. 2 through 10, the process of the invention to fabricate the BEST DRAM will be described. Referring now more particularly to FIG. 2, there is shown a portion of a semiconductor substrate 10. A silicon nitride layer 14 has been formed over the substrate. A pad oxide layer, not shown, may be formed underlying the silicon nitride layer. The silicon nitride layer has a thickness of between about 1800 and 2500 Angstroms. A a hard mask, not shown, (typically oxide such as borophosphosilicate glass with a thickness of 1200 to 1500 Angstroms) is formed over the silicon nitride layer for etching deep trenches into the substrate. In a typical process, the deep trenches are filled with a sacrificial layer which is recessed to remain only in the lower portion of the deep trenches. Then a dielectric collar layer 20 is conformally deposited in the upper portion of the deep trenches. The sacrificial layer is removed, leaving the collar 20. The substrate around the lower portion of the trenches is doped by arsenic silicon glass (ASG) or gas phase doping (GPD), for example. A capacitor dielectric layer 52 is grown or deposited within the lower portion of the deep trenches. Then a silicon layer 54 is deposited within the deep trenches and planarized to the silicon nitride layer, as shown in FIG. 2.

Preferably, the silicon layer 54 is doped amorphous silicon. However, if the solid diffusion source is silicon germanium ($Si_xGe_{1-x}$), then the silicon layer 54 can be polysilicon.

Figure 3:
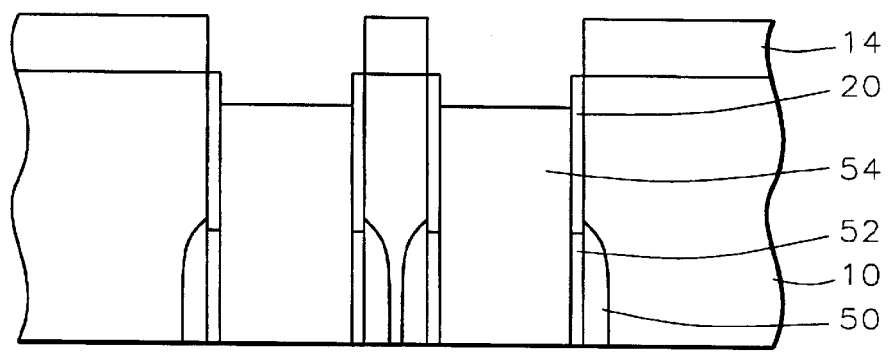

Referring now to FIG. 3, the amorphous silicon layer 54 within the trenches is recessed, such as by an isotropic downstream plasma etch or by a reactive ion etch. The recess depth can be optimized to provide the optimal buried strap thickness. The recess should be between about 50 and 200 nm from the top silicon nitride surface.

Figure 4:
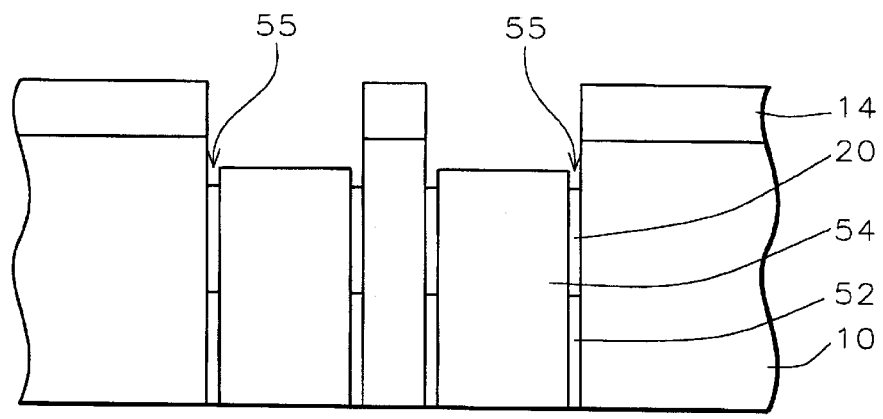

Referring now to FIG. 4, the collar 20 is etched using a wet process to form a collar divot 55 of between about 30 and 50 nm below the recess 2 depth.

Figure 5:
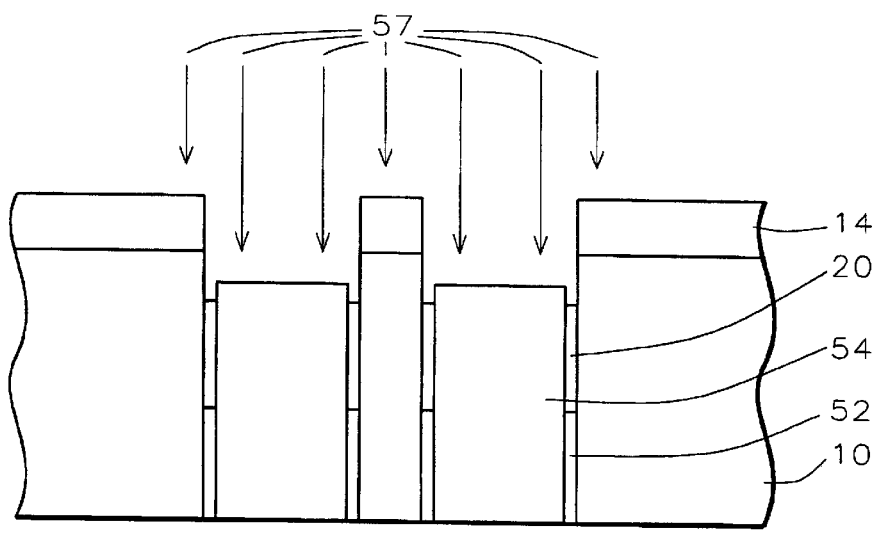

Referring now to FIG. 5, optionally plasma doping 57 is performed to ensure amorphous phase of the silicon layer 54. Plasma doping is an alternative implantation method for a high dose, low energy ion implantation application. A processing wafer is immersed in a plasma and is pulse biased to extract plasma ions toward the wafer. Since the plasma is a charge-neutralized media, it is not subject to space-charge limited ion extraction, thus providing a high ion flux density at a lower extraction voltage.

A silicon nitride liner or other barrier layer may be formed using chemical vapor deposition (CVD) or atomic layer deposition (ALD) methods. This liner layer 60, not shown, is formed within the collar divot 55. The liner layer may have a thickness of between about 5 and 30 nm. The liner layer is optional to the process of the invention. The liner layer suppresses excess out-diffusion of dopants into the source/drain region and to prevent dislocation in the silicon layer which may cause leakage. The liner layer is optional in the HSG process because HSG will not grow on crystalline silicon due to lack of surface mobility of silicon atoms.

Now, a buried strap is formed by a selective deposition process. A conductive layer is deposited selectively. This layer must serve as a dopant source. A selective hemispherical grain (HSG) method is preferred. If a HSG method is not used, another selective deposition method such as SiGe, selective polysilicon, or pseudo-epitaxial silicon methods may be used.

Figure 6:
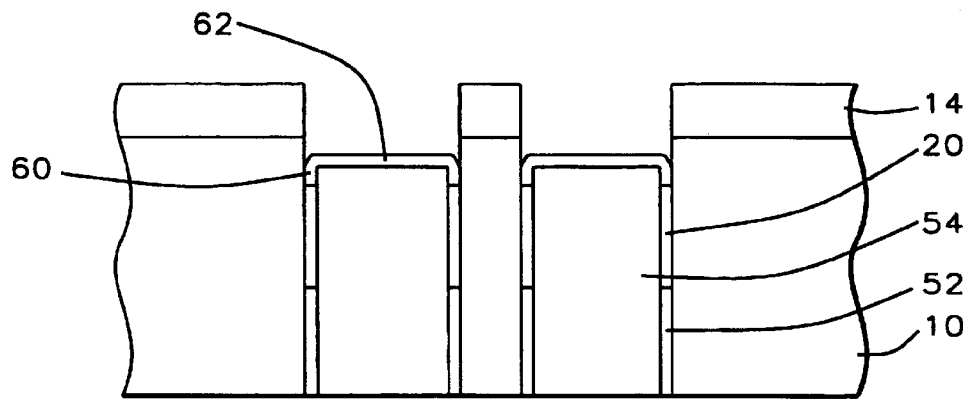

The preferred selective HSG polysilicon process will now be described. Preferably, the optional surface amorphization step by plasma doping has been performed to provide surface mobility of the silicon atoms in 54 to promote HSG formation. Now, selective HSG 62 is formed as is conventional in the art for stacked capacitor applications, as shown in FIG. 6.

Figure 7:
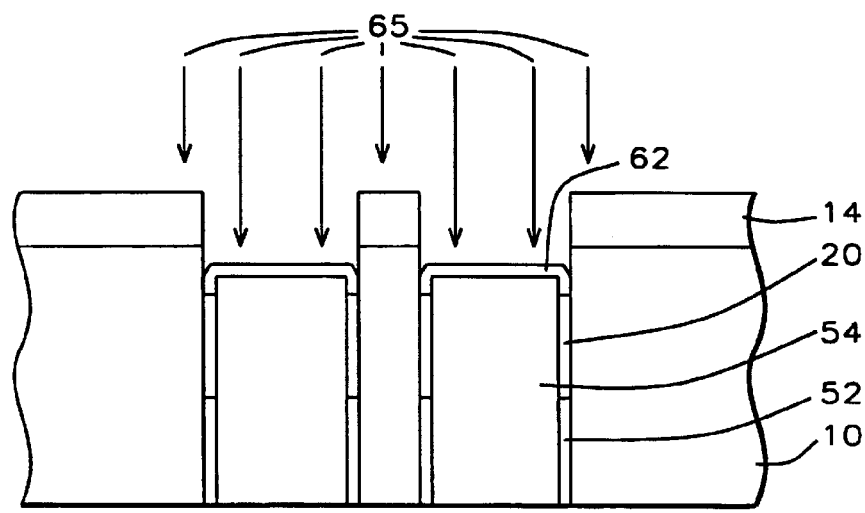

The polysilicon 62 (or other conductive layer) can be doped in-situ during or immediately after the deposition step. Alternatively, the polysilicon layer 62 can be doped after deposition using plasma doping, plasma ion immersion implantation (PIII), or gas phase doping (GPD) for fine dose control. FIG. 7 illustrates the alternative post-deposition doping step 65. Doping (in-situ or post-deposition) uses arsenic or phosphorus ions for a doping concentration of between about 1E18 to 1E21 ions/$cm^3$.

The polysilicon layer 62 formed by HSG has a thickness of between about 20 and 100 nm and a grain size of between about 10 and 50 nm. This HSG layer will form the buried strap of the present invention. The selective HSG polysilicon deposition method deposits the buried strap polysilicon to a controlled thickness. This process avoids planarization of the buried strap layer by CMP which adds process complexity.

Figure 8:
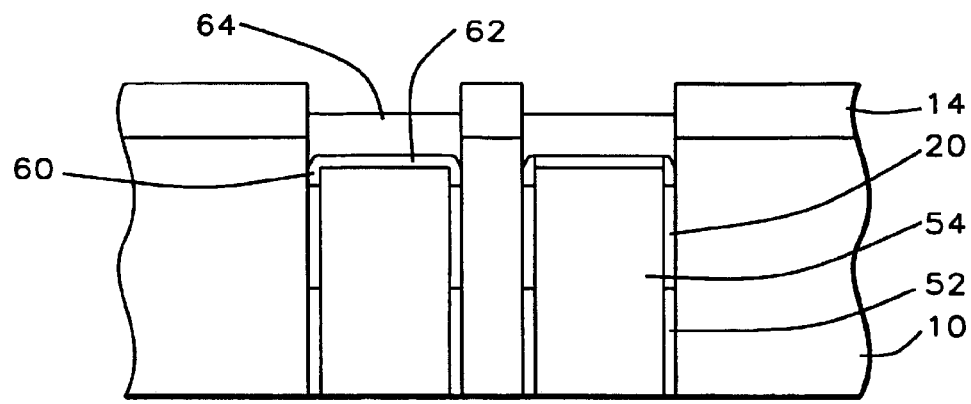

Optionally, a capping layer 64 may be formed over the buried strap 62, as shown in FIG. 8. The optional capping layer 64 may be used to suppress dopant loss or to minimize the surface stress which might cause dislocation into the crystalline silicon substrate. A trench top oxide or other capping layer such as silicon nitride 64 may be deposited using a selective oxidation method or by an unbiased silicon nitride liner method, whichever is appropriate for a chosen integration method, to a thickness of between about 10 and 20 nm. This additional layer may serve as a sacrificial capping layer against any contamination during or after the integration steps such as annealing or implantation steps.

Figure 9:
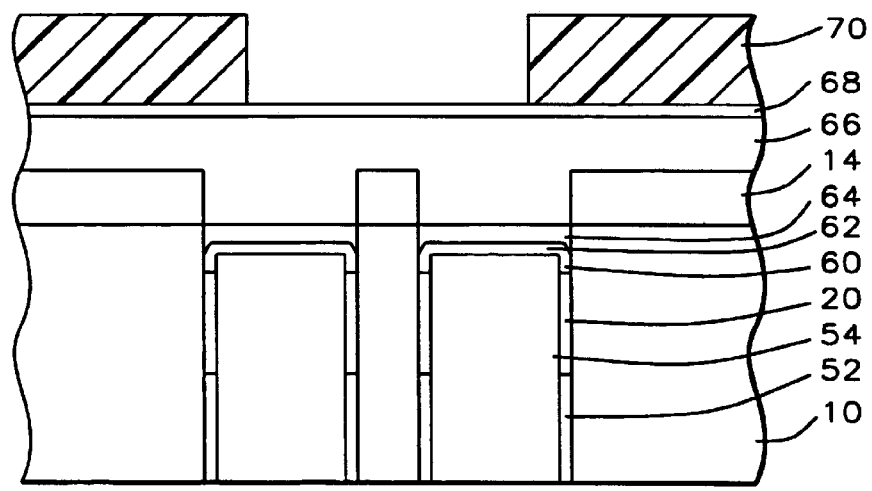

Processing continues as is conventional in the art to form shallow trench isolation (STI). For example, FIG. 9 shows the formation of a hard mask 66. For example, the hard mask 66 may comprise borosilicate glass (BSG) or borophosphosilicate glass (BPSG). An antireflective coating (ARC) 68 is formed over the hard mask and a photoresist mask 70 is formed over the ARC layer.

Figure 10:
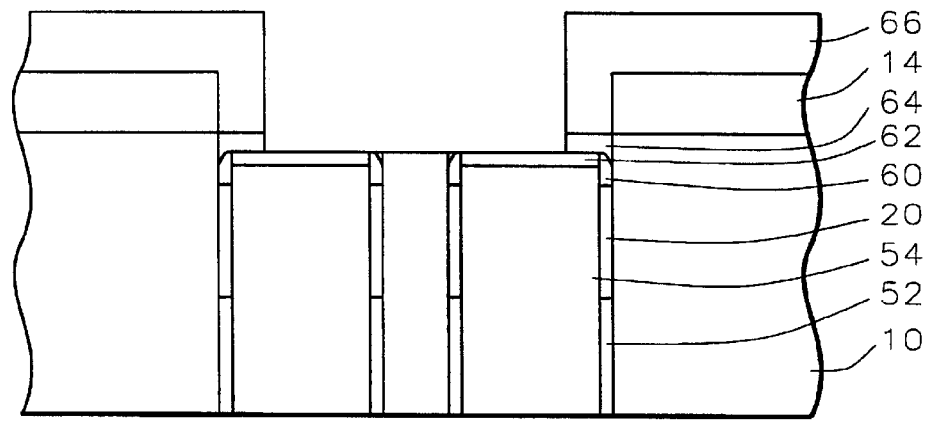
Figure 11:
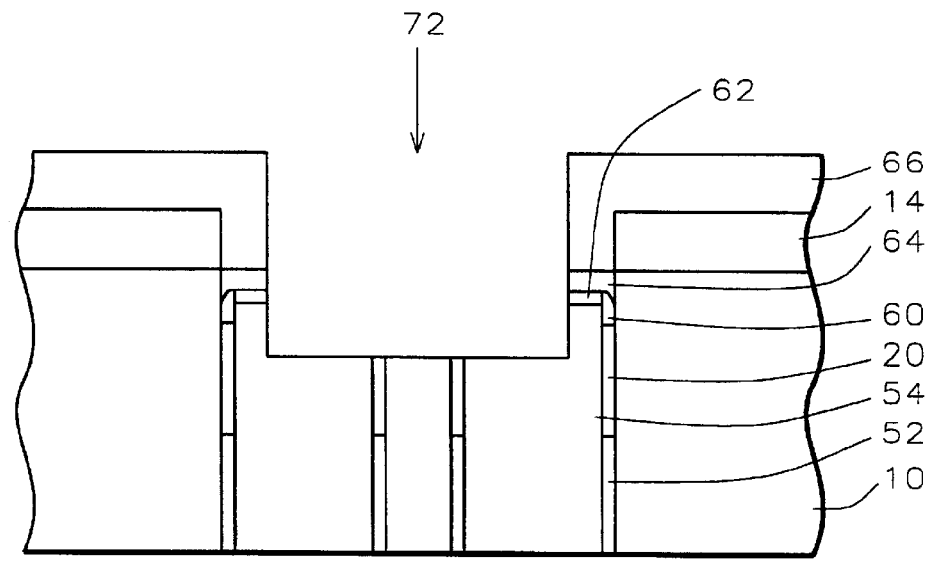

The STI area pattern is transferred to the hard mask as shown in FIG. 10 and the photoresist mask is stripped. Now, as illustrated in FIG. 11, the deep trench area is etched into where it is not covered by the hard mask to form a STI trench 72.

Figure 12:
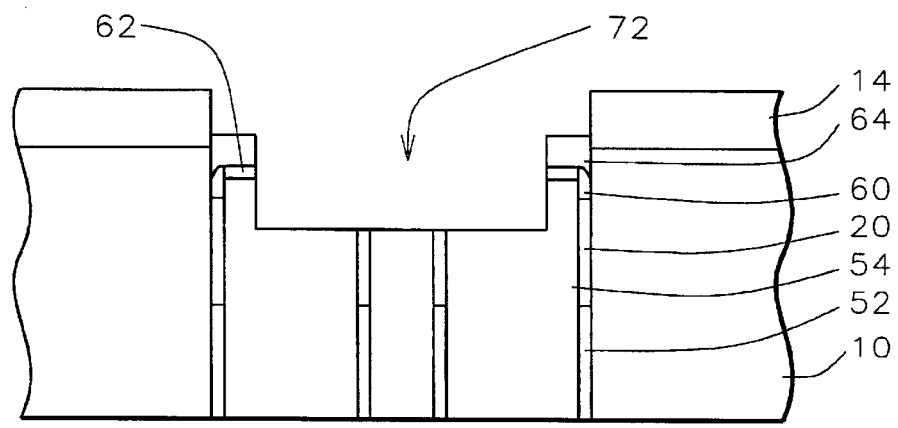
Figure 13:
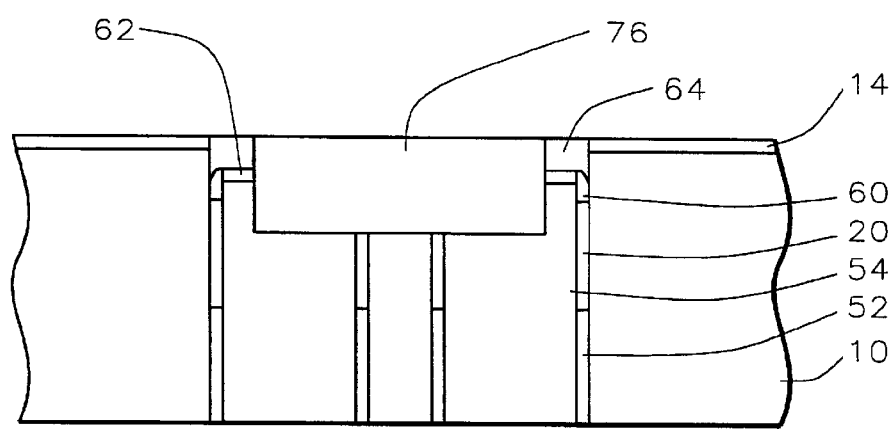

Now, the hard mask is stripped using a wet etching recipe that is selective to silicon and thermal oxide as shown in FIG. 12. Now, the trench 72 is filled with an oxide layer to form a shallow trench isolation (STI) region 76. For example, the STI region is filled with an oxide using a high density plasma chemical vapor deposition (HDP-CVD) process. The oxide is planarized, for example, by chemical mechanical polishing (CMP) to complete the STI region, as illustrated in FIG. 13. The silicon nitride layer 14 serves as a polish stop during the STI CMP step.

Figure 14:
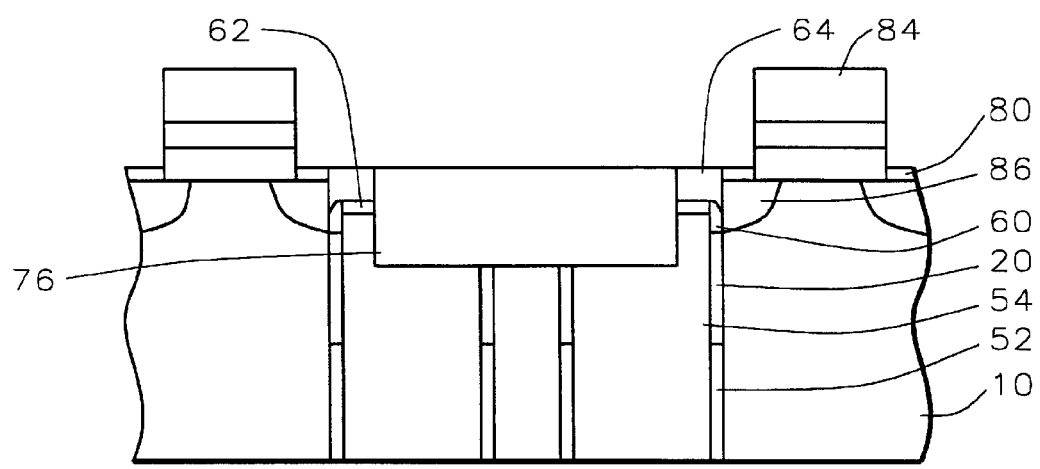

The silicon nitride layer 14 is stripped using a wet etching process. Now, a gate oxide layer 80 is grown on the substrate surface in the active area, as shown in FIG. 14. Gate electrodes 84 are formed as is conventional in the art. Buried strap diffusion junction 86 is formed by outdiffusion from the buried strap 62 during thermal processes. The diffusion junction 86 provides a connection between the deep trench capacitor 54 and the transistor 84.

The process of the present invention provides good control of buried strap thickness and doping level. The selective deposition process used to form the buried strap, preferably a HSG process, provides simplified process steps, eliminating the recess 3 and buried strap polysilicon CMP steps. The process of the present invention is applicable to surface strap and vertical gate processes. The present invention provides low process cost and device extendibility by controlling short channel effects.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried strap in the fabrication of a deep trench DRAM integrated circuit device comprising:

providing a deep trench into said substrate;

forming a collar on an upper portion of said deep wench;

filling said deep wench and overlying said collar with a silicon layer wherein said silicon layer forms a deep trench capacitor;

recessing said silicon layer below a top surface of said substrate to leave a recess;

etching away a top portion of said collar to leave a collar divot; and selectively depositing a selective deposition layer into said deep trench and filling said collar divot wherein said selective deposition layer is not deposited outside of said deep trench to form said buried strap in the fabrication of said deep wench DRAM integrated circuit device.

2. The method according to claim 1 wherein said collar comprises thermally grown or deposited oxide.

3. The method according to claim 1 wherein said silicon layer comprises amorphous silicon.

4. The method according to claim 1 wherein said recess has a depth of between about 50 and 200 nm.

5. The method according to claim 1 wherein said collar divot has a depth of between about 30 and 50 nm.

6. The method according to claim 1 wherein said selective deposition layer is selected from the group consisting of: a hemispherical grain polysilicon layer, a SiGe layer, a poly-silicon layer, and a pseudo-epitaxial silicon layer.

7. The method according to claim 1 wherein said step of selectively depositing said selective deposition layer comprises forming a hemispherical grain polysilicon layer to a thickness of between about 20 and 100 nm and having a grain size of between about 10 and 50 nm.

8. The method according to claim 7 before said step of selectively depositing said hemispherical grain polysilicon layer further comprising plasma doping said silicon layer to amorphize a surface of said silicon layer.

9. The method according to claim 7 wherein said step of selectively depositing said hemispherical grain polysilicon layer comprises in-situ doping of said polysilicon layer.

10. The method according to claim 1 after said step of selectively depositing said selective deposition layer further comprising doping said selective deposition layer to a concentration of between about 1E18 and 1E21 ions/cm$^3$.

11. The method according to claim 10 wherein said doping step is selected from the group consisting of: plasma doping, plasma ion immersion implantation, and gas phase doping.

12. The method according to claim 1 further comprising:

forming a shallow trench isolation region partially within said deep trench and said buried strap area; and annealing said substrate whereby dopants from said buried strap diffuse into said substrate to form a buried strap diffusion and wherein said buried strap diffusion connects said deep trench capacitor to a gate electrodes to complete formation of said deep trench DRAM device.

13. A method of forming a buried strap in the fabrication of a deep trench DRAM integrated circuit device comprising:

providing a deep trench into said substrate;

forming a collar on an upper portion of said deep trench;

filling said deep trench and overlying said collar with a silicon layer wherein said silicon layer forms a deep trench capacitor;

recessing said silicon layer below a top surface of said substrate to leave a recess;

etching away a top portion of said collar to leave a collar divot;

selectively depositing a selective deposition layer into said deep trench and filling said collar divot wherein said selective deposition layer is not deposited outside of said deep trench to form said buried strap;

forming a shallow trench isolation region partially within said deep trench and said buried strap area; and annealing said substrate whereby dopants from said buried strap diffuse into said substrate to form a buried strap diffusion and wherein said buried strap diffusion connects said deep trench capacitor to a gate electrodes to complete formation of said deep trench DRAM device.

14. The method according to claim 13 wherein said selective deposition layer is selected from the group consisting of: a hemispherical grain polysilicon layer, a SiGe layer, a polysilicon layer, and a pseudo-epitaxial silicon layer.

15. The method according to claim 13 wherein said step of selectively depositing said layer comprises in-situ doping of said layer.

16. The method according to claim 13 after said step of selectively depositing said layer further comprising doping said selective deposition layer to a concentration of between about 1E18 and 1E21 ions/cm$^3$.

17. The method according to claim 16 wherein said doping step is selected from the group containing: plasma doping, plasma ion immersion implantation, and gas phase doping.

18. A method of forming a buried strap in the fabrication of a deep trench DRAM integrated circuit device comprising:

providing a silicon nitride layer on a substrate;

etching a deep trench through said silicon nitride layer and into said substrate;

forming a collar on an upper portion of said deep trench;

forming a buried plate around a lower portion of said deep trench;

depositing a dielectric layer on sidewalls of said deep trench;

filling said deep trench and overlying said collar with a silicon layer wherein said silicon layer forms a deep trench capacitor;

recessing said silicon layer below a top surface of said substrate to leave a recess;

etching away a top portion of said collar to leave a collar divot;

selectively depositing a layer into said deep trench and filling said collar divot wherein said layer is not deposited outside of said deep trench to form said buried strap; and doping said selective deposition layer and annealing said substrate whereby dopants in said buried strap outdiffuse into said substrate to form a buried strap outdiffusion junction in the fabrication of said deep trench DRAM integrated circuit device.

19. The method according to claim 18 wherein said step of forming said collar comprises:

growing or depositing an oxide layer within said deep trench; and thermally densifying said oxide layer.

20. The method according to claim 18 wherein said silicon layer comprises amorphous silicon.

21. The method according to claim 18 wherein said selective deposition layer is selected from the group consisting of: a hemispherical grain polysilicon layer, a SiGe layer, a polysilicon layer, and a pseudo-epitaxial silicon layer.

22. The method according to claim 18 wherein said step of doping said selective deposition layer is selected from the group consisting of: in-situ doping, plasma doping, plasma ion immersion implantation, and gas phase doping.

23. The method according to claim 18 further comprising forming a capping layer overlying said selective deposition layer.

24. The method according to claim 23 wherein said step of forming said capping layer is selected from the group consisting of: selective oxide deposition and silicon nitride deposition.

25. The method according to claim 18 further comprising:

forming a shallow trench isolation region partially within said deep trench and said buried strap area; and forming gate electrodes wherein said buried strap diffusion connects said deep trench capacitor to one of said gate electrodes to complete formation of said deep trench DRAM device.

* * * * *